United States Patent [19]

Schellenberg

[11] 4,386,324
[45] May 31, 1983

[54] PLANAR CHIP-LEVEL POWER COMBINER

[75] Inventor: James M. Schellenberg, Huntington Beach, Calif.

[73] Assignee: Hughes Aircraft Company, El Segundo, Calif.

[21] Appl. No.: 213,524

[22] Filed: Dec. 5, 1980

[51] Int. Cl.³ .............................................. H03F 3/60
[52] U.S. Cl. .................................. 330/277; 330/286; 330/295; 333/128; 333/136; 333/238; 333/246
[58] Field of Search ................. 330/53, 277, 286, 287, 330/295, 307; 333/100, 127, 128, 136, 238, 246, 247

[56] References Cited

U.S. PATENT DOCUMENTS 3,963,993  6/1976  Hoffman et al. ............... 330/295 X
4,129,839 12/1978  Galani et al. ....................... 333/128
4,311,965  1/1982  Jones ............................... 330/295 X

OTHER PUBLICATIONS

Sukhova et al., "Power Dividers Constructed from Nonhomogeneous Lines", *Radio Engineering and Electron Physics*, vol. 22, No. 1, pp. 31–36, Jan. 1977.

Primary Examiner—James B. Mullins
Attorney, Agent, or Firm—Charles D. Brown; L. V. Link, Jr.; A. W. Karambelas

[57] ABSTRACT

A chip-level power combiner comprises plural amplifier devices, a power divider, and a power combiner. The power divider and the power combiner are disposed in mirror-image fashion. Each divider/combiner comprises a first divider/combiner section having plural branch transmission lines cascading from/to a main transmission line, and a second divider/combiner section having plural feeder transmission lines cascading from/to each branch of the transmission line. Each of the branch and feeder transmission lines has an isolation resistor interposed between adjacent lines, and the feeder transmission lines are tapered.

9 Claims, 2 Drawing Figures

PLANAR CHIP-LEVEL POWER COMBINER

BACKGROUND OF THE INVENTION

1. Field of the Invention

This invention relates to the field of divider/combiners used for amplifying microwave-frequency electromagnetic energy. More specifically, the invention relates to devices for combining an array of three-terminal amplifying devices at the chip level.

2. Description of the Prior Art

The generation of microwave power at relatively large amplitudes has been accomplished in the past by paralleling plural three-terminal amplifier devices (cells) with bond wires. This simple technique works well at lower frequencies, but, at higher frequencies, amplifier device paralleling presents numerous problems that make it undesirable. Each amplifier device will share input power unequally in the absence of any systematic means of controlling the incident power density at the point input power is divided. Such imbalance between devices cause losses due to circulating currents. Transverse propagating modes occur when devices are connected in parallel with non-zero length lines, and such modes can cause push-pull oscillations between devices that can result in catastrophic failure. The shunting effect of paralleled devices causes high matching circuit losses and narrow bandwidth.

These problems and others have recently encouraged the use of lumped-element cell combining circuits at X-band frequencies. The lumped-element technique employs individual low-pass LC matching networks in an effort to solve the problem of unequal input power sharing. However, due to the lack of inherent isolation, the lumped-element technique is only marginally successful, and does not address the other problems associated with three-terminal cell combining.

SUMMARY OF THE INVENTION

It is a purpose of this invention to provide a new and improved divider/combiner of the type described which overcomes most, if not all, of the above-identified disadvantages of the prior art power-combining circuits, and which is operable to efficiently divide or combine microwave power in a microwave power-combining circuit.

It is also a purpose of this invention to provide a cell combiner having a high operational efficiency and a moderate bandwidth capability at Ku-band frequencies and above.

To accomplish these purposes while overcoming the above disadvantages of the prior art, the present invention provides a microwave power-combining circuit which can be implemented directly on the carrier, and which holds the chip carrying the array of three-terminal amplifier devices (cells) to be combined. The power-combining circuit comprises a power divider, the array of amplifier devices, and a power combiner. The power divider and power combiner are arranged in mirror-image fashion on both sides of the amplifier array. Each divider/combiner consists of a two-section cascade of divider/combiner circuits with each section nominally 90 degrees in electrical length at the design center frequency. The first divider/combiner section comprises plural branch transmission lines cascading from/to the main input/output transmission line.

In a preferred embodiment of the invention, the first divider/combiner section consists of a binary Wilkinson divider. Wilkinson dividers are well known and are described in "An N-Way Hybrid Power Divider" by E. Wilkinson, MTT-8, No. 1, pp. 116-118, (January, 1960). The second divider/combiner section comprises plural feeder transmission lines cascading from/to each of the branch transmission lines. Each of the feeder transmission lines is connected to a power amplifier. Each of the feeder transmission lines is tapered, being relatively narrow at the end connected to the first divider/combiner section and relatively wide at the end connected to the amplifier devices.

Adjacent branch transmission lines and adjacent feeder transmission lines are isolated by the network consisting of isolation resistors connected between adjacent transmission lines, and the 90 degree transmission line segments.

DETAILED DESCRIPTION OF THE INVENTION

Figure 1:
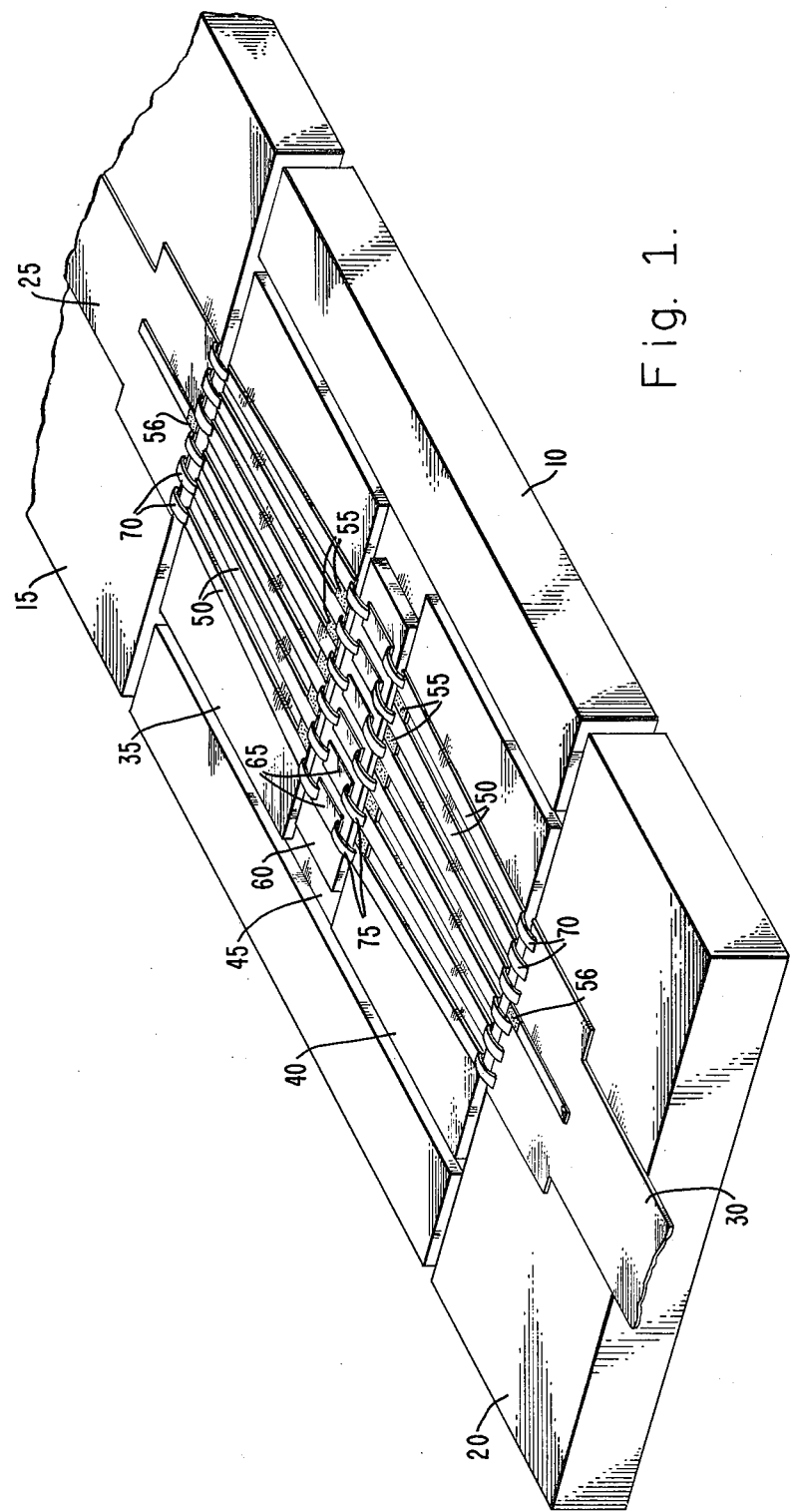
FIG. 1 is a perspective view of a chip-level power divider/combiner according to a preferred embodiment of the present invention.

FIG. 1 shows a chip-level power divider/combiner according to the present invention. A chip carrier 10, including a ground plane not shown, is disposed between two substrate blocks 15 and 20. Each substrate block 15 and 20 has a conventional binary Wilkinson divider 25 and 30 disposed on its top surface. The Wilkinson dividers 25 and 30 are microstrip transmission lines and are formed by depositing metal on the surface of the substrate blocks 15 and 20 and etching using conventional photolithographic techniques.

Two thin sapphire substrates 35 and 40 are disposed in a slot 45 in the chip carrier 10. The sapphire substrates 35 and 40 each have plural feeder transmission lines 50 disposed on their top surface, and the isolation resistors 55 are disposed as shown between adjacent feeder transmission lines 50. The isolation resistors 56 are disposed between adjacent branch transmission lines of the Wilkinson dividers 25 and 30.

An FET substrate (chip) 60 is disposed between the sapphire substrates 35 and 40. Plural field-effect-transistors (FETs) 65 are formed on the top surface of the FET substrate 60 using conventional techniques. The FETs 65 are aligned and equally spaced, and the number of feeder transmission lines 50 on each sapphire substrate 35 and 40 is equal to the number of FETs 65. Each of the feeder transmission lines 50 extends the full length of its sapphire substrate. The feeder transmission lines are each tapered to provide phase compensation, with the wider end of each line adjacent the FET chip 60 and the narrower end adjacent the respective Wilkinson divider 25 and 30.

The Wilkinson divider 25 is electrically connected to the feeder transmission lines of sapphire substrate 35 by bond wires 70. Each bond wire 70 connects one feeder transmission line 50 to one of the two Wilkinson lines, and the feeder transmission lines 50 are apportioned equally between the Wilkinson lines.

The wider end of each feeder transmission line 50 on the sapphire substrate 35 is connected to the gate of its corresponding FET 65 by bond wires 75. The drain of each FET 65 is connected to the wider end of the corresponding feeder transmission line 50 of sapphire substrate 40. The feeder transmission lines 50 of the sapphire substrate 40 are connected to the Wilkinson divider 30 in the same manner as the previously described connection between the feeder transmission lines of sapphire substrate 35 and the Wilkinson divider 25. The specific above-identified FET electrode (gate, source and drain) connections are not shown, since the particular circuit details are well known to those skilled in this art.

The connection between the bond wires 75 and the active areas of the FETs 65 is accomplished by forming a conductive path in the FET substrate chip 60 between the appropriate FET active area and a small gold pad formed on the surface of the FET substrate chip 60. The appropriate gold bond wire 75 is then bonded to the gold pad by a technique commonly known as thermal compression bonding. Connections made in this manner are well known in the electrical arts and are not shown in the drawings.

The circuit design illustrated in FIG. 1 does not require feeder transmission lines 50 to be isolated except at the ends adjacent the FETs 65. The proximity coupling effects between adjacent transmission lines is an integral part of the design. During even-mode excitation, the presence of adjacent transmission lines increases the characteristic impedance of a given line. The feeder transmission line 50 on each side of the array has only one adjacent transmission line and, therefore, a lower characteristic impedance than the internal lines. To compensate, the side transmission lines are made narrower than the internal lines, thereby making uniform the characteristic impedances of all feeder transmission lines 50. Likewise, the value of the isolation resistors 55 on each side are somewhat lower than the internal resistors.

Figure 2:
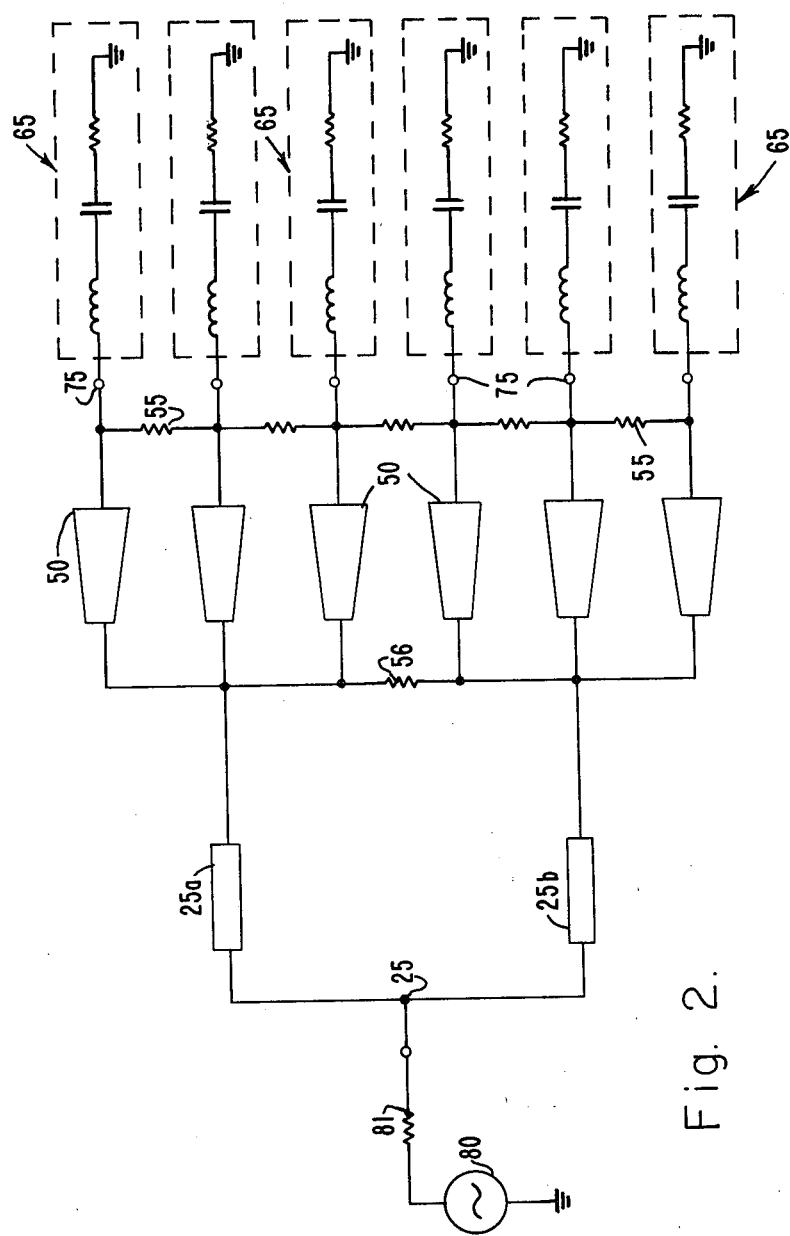
FIG. 2 is an equivalent circuit diagram of a power divider/combiner of the same preferred embodiment of the present invention.

FIG. 2 shows an equivalent circuit diagram of the divider portion of the power combiner system. A source of power 80 passes through a source impedance resistor 81 and is fed to the Wilkinson divider 25. Equal portions of the power supplied by power source 80 are conducted through branch transmission lines 25a and 25b, which are isolated by resistor 56. At the end of these two branch transmission lines 25a and 25b, power is equally divided among the feeder transmission lines 50, which are isolated by isolation resistors 55. At the end of each of the feeder transmission lines 50, power is transmitted via a bond wire 75 to the respective FET 65. Of course, the power outputs of the six FETs are combined by a combiner circuit that is a mirror-image of the divider circuit just described.

In this preferred embodiment, the Wilkinson dividers 25 and 30, and the feeder transmission lines 50 can be formed of chrome-gold, which is deposited by standard sputtering techniques. The isolation resistors 55 and 56 can be made of tantalum nitrite thin-film resistors. The chip carrier 10 can be made of molybdenum or copper, and substrate blocks 15 and 20 can be made of alumina. The preferred embodiment of the invention is not limited to these particular materials; any suitable materials or deposition techniques can be employed. In addition, the number of cells among which power is divided and recombined can be more or less than the six described here.

The embodiment of the invention described above is especially advantageous in that it optimizes packing density of the combiner package, thereby reducing weight and size while retaining desirable power output levels. The particular coplanar arrangement of the divider and combiner circuits shown in the drawing and previously described enables the optimization of packing density.

It is understood that the above-described preferred embodiment is merely illustrative of the many possible embodiments that represent applications of the principles of this invention. Numerous and varied arrangements can be devised by persons skilled in this art without departing from the spirit or scope of the invention.

What is claimed is:

1. A chip-level power combiner system, including plural amplifier means for amplifying an electrical signal, a divider means for dividing input power among the plural amplifier means, and a combiner means for combining the outputs of the plural amplifier means, wherein the divider means and the combiner means each comprise:
(a) a first divider/combiner section having plural branch transmission lines cascading from/to a main transmission line;
(b) a second divider/combiner section having plural feeder transmission lines cascading from/to each of the branch transmission lines, wherein each feeder transmission line is tapered and disposed so that the relatively wide end is connected to the amplifier means and the relatively narrow end is connected to the first divider/combiner section;
(c) first resistor means disposed between the branch transmission lines of the first divider/combiner section for electrically isolating each branch transmission line from adjacent branch transmission lines; and
(d) second resistor means disposed between the feeder transmission lines of the second divider/combiner section for electrically isolating each feeder transmission line from adjacent feeder transmission lines.

2. A circuit-level power divider/combiner comprising:
(a) a first divider/combiner section comprising:
  (i) a main transmission line,
  (ii) plural branch transmission lines, each having one end electrically connected to the main transmission line, and
  (iii) branch isolation means for electrically isolating adjacent branch transmission lines; and
(b) a second divider/combiner section comprising:
  (i) plural sets of feeder transmission lines, one set associated with each branch transmission line, each set comprising at least one feeder transmission line, wherein each feeder transmission line has a relatively narrow first end electrically connected to its respective branch transmission line, and said transmission lines are disposed in an array with the transmission lines located at the side of the array configured to be narrower than the transmission lines on the interior of the array; and
  (ii) feeder isolation means for electrically isolating adjacent feeder transmission lines.

3. A chip-level power divider/combiner comprising:
(a) a first planar substrate;
(b) a second planar substrate disposed adjacent the first planar substrate;
(c) a first combiner/divider section disposed on the first planar substrate comprising:
  (1) a conductive main transmission line,
  (2) plural conductive branch transmission lines each having a first end electrically connected to one end of the main transmission line, and each having a second end terminating near an edge of the first planar substrate, and (3) branch isolation means for electrically isolating adjacent branch transmission lines;

(d) a second combiner/divider section disposed on the second planar substrate comprising:

(1) plural sets of feeder transmission lines, one set for each branch transmission line, each set comprising at least one feeder transmission line, wherein each feeder has a relatively narrow first end disposed near the edge of the second substrate that lies adjacent the first substrate and a relatively wide second end disposed near the opposite edge, and said feeder transmission lines are disposed in an array with the transmission lines located at the side of the array configured to be narrower than the transmission lines on the interior of the array; and (2) feeder isolation means for electrically isolating adjacent feeder transmission lines; and (e) connector means for connecting each feeder transmission line of each set of feeder transmission lines to the second end of the branch transmission line associated with that set.

4. The power divider/combiner of claims 1, 2, or 3 wherein all transmission lines comprise conductive microstrip lines deposited on a substrate.

5. The power divider/combiner of claim 1 wherein the amplifier means comprise field-effect-transistors.

6. The power divider/combiner of claims 1, 2, or 3 wherein the first divider/combiner section comprises a binary Wilkinson divider.

7. The power divider/combiner of claim 3 wherein the second planar substrate is made of sapphire.

8. A coplanar arrangement for dividing, amplifiying, and combining microwave power, the coplanar arragement having an optimized packing density and comprising:

(a) a first microstrip Wilkinson divider circuit disposed on a first substrate, for dividing microwave power from a common input source;

(b) a second microstrip Wilkinson divider circuit disposed on a second substrate, for combining microwave power to a common output load;

(c) plural microstrip divider transmission lines cascading from each of the legs of the first Wilkinson divider circuit, the divider transmission lines lying on a third substrate, and being disposed in an array with the transmission lines at the side of the array configured to be narrower than transmission lines on the interior of the array;

(d) plural microstrip combiner transmission lines cascading from each of the legs of the second Wilkinson divider circuit, the combiner transmission lines lying on a fourth substrate, and being disposed in an array with the transmission lines at the side of the array configured to be narrower than transmission lines on the interior of the array;

(e) a plurality of field-effect-transistor cells (FETs) formed on a fifth substrate and disposed between the third and fourth substrates, so that the third, fourth, and fifth substrates lie on a sixth substrate in a compact packing arrangement;

(f) means for coupling each leg of the first Wilkinson divider circuit to its respective plural divider transmission lines;

(g) means for coupling each leg of the second Wilkinson divider circuit to its respective plural combiner transmission lines;

(h) means for coupling each divider transmission line to the gate of one of the FETs;

(i) means for coupling the drain of each FET to one of the combiner transmission lines;

(j) isolation resistor means disposed between each pair of adjacent legs of the first and second Wilkinson divider circuits;

(k) isolation resistor means disposed between each pair of adjacent divider transmission lines; and (l) isolation resistor means disposed between each pair of adjacent combiner transmission lines.

9. A coplanar arrangement for dividing, amplifying, and combining microwave power, the coplanar arrangement having an optimized packing density and comprising:

(a) a first plurality of transmission lines disposed on a first substrate for dividing microwave power from a common input source;

(b) a second plurality of transmission lines disposed on a second substrate for combining microwave power at a common output point;

(c) said first plurality of transmission lines and said second plurality of transmission lines each being disposed in an array with the transmission lines at the sides of each array configured to be narrower than the transmission lines on the interior of the array;

(d) a plurality of field-effect-transistor cells (FETs) formed on a third substrate that is disposed between the first and second substrates, so that the first, second and third substrates lie in a compact packing arrangement wherein the first, second and third substrates are substantially equal in thickness and width; and (e) means coupling the first and second pluralities of transmission lines to the inputs and outputs, respectively, of the plurality of FETs, whereby a combined and amplified power output may be derived from the second plurality of transmission lines.

* * * * *